United States Patent
Zeller et al.

(10) Patent No.: US 11,747,425 B2
(45) Date of Patent: Sep. 5, 2023

(54) METHOD FOR REDUCING ARTIFACTS IN IMAGE DATA SETS ACQUIRED USING MAGNETIC RESONANCE

(71) Applicant: Siemens Healthcare GmbH, Erlangen (DE)

(72) Inventors: Mario Zeller, Erlangen (DE); Flavio Carinci, Würzburg (DE)

(73) Assignee: Siemens Healthcare GmbH, Erlangen (DE)

(*) Notice: Subject to any disclaimer, the term of this patent is extended or adjusted under 35 U.S.C. 154(b) by 0 days.

(21) Appl. No.: 17/709,654

(22) Filed: Mar. 31, 2022

(65) Prior Publication Data
US 2022/0317220 A1 Oct. 6, 2022

(30) Foreign Application Priority Data
Mar. 31, 2021 (DE) ...................... 10 2021 203 269.9

(51) Int. Cl.
- G01V 3/00 (2006.01)
- G01R 33/565 (2006.01)
- G01R 33/483 (2006.01)
- G01R 33/48 (2006.01)

(52) U.S. Cl.
CPC ... G01R 33/56509 (2013.01); G01R 33/4826 (2013.01); G01R 33/4835 (2013.01)

(58) Field of Classification Search
CPC .............. G01R 33/3415; G01R 33/543; G01R 33/5659; G01R 33/36; A61B 5/055
USPC ....................................................... 324/309
See application file for complete search history.

(56) References Cited

U.S. PATENT DOCUMENTS

| | | | |
|---|---|---|---|
| 2015/0015691 A1* | 1/2015 | Forman | A61B 5/055 348/77 |
| 2016/0104279 A1 | 4/2016 | Li et al. | |
| 2018/0095150 A1 | 4/2018 | Zeller | |
| 2019/0086496 A1 | 3/2019 | Moeller et al. | |

FOREIGN PATENT DOCUMENTS

| | | | | |
|---|---|---|---|---|
| CN | 108430321 A * | 8/2018 | | A61B 5/0205 |
| DE | 102014202639 A1 * | 8/2014 | | B60W 40/10 |
| DE | 102016218955 A1 | 4/2018 | | |

(Continued)

OTHER PUBLICATIONS

Breuer, Felix A. et al.: "Controlled Aliasing in Parallel Imaging Results in Higher Acceleration (CAIPIRINHA) for Multi-Slice Imaging"; in: Magnetic Resonance in Medicine 53: S. 684-691 (2005); 2005.

(Continued)

*Primary Examiner* — Walter L Lindsay, Jr.
*Assistant Examiner* — Frederick Wenderoth
(74) *Attorney, Agent, or Firm* — Banner & Witcoff Ltd.

(57) ABSTRACT

A method for reconstructing single-slice image data sets from k-space measured data sets that have been acquired simultaneously from at least two slices from an examination object. The method includes an iterative modification and hence an optimization of the underlying k-space trajectories in the reconstruction of individual image data sets from collapsed measured data sets acquired from a plurality of slices and hence a retrospective reduction of interference in the individual image data sets that are obtained.

14 Claims, 2 Drawing Sheets

(56) References Cited

FOREIGN PATENT DOCUMENTS

WO     WO-2010141272 A1 * 12/2010   ......... G01N 30/8644
WO     WO-2012043311 A1 *  4/2012   ........... A61B 5/7207

OTHER PUBLICATIONS

Setsompop, Kawin, et al.: "Blipped?controlled aliasing in parallel imaging (blipped-CAIPI) for simultaneous multislice echo planar imaging with reduced g?factor penalty"; in: Magnetic Resonance in Medicine; vol. 67,5; pp. 1210-1224; 2012; DOI 10.1002/mrm. 23097; 2012.

* cited by examiner

METHOD FOR REDUCING ARTIFACTS IN IMAGE DATA SETS ACQUIRED USING MAGNETIC RESONANCE

TECHNICAL FIELD

The disclosure relates to a method for reducing artifacts in image data sets acquired using magnetic resonance, in particular to a method for the improved reconstruction of single-slice image data sets from k-space measured data sets that have been acquired simultaneously from at least two slices of an examination object.

BACKGROUND

Magnetic resonance technology (hereafter the abbreviation MR stands for magnetic resonance) is a known technology with which images of the inside of an examination object can be generated. Put simply, for this purpose, the examination object is positioned in a magnetic resonance apparatus in a comparatively strong, static, homogeneous main magnetic field, also known as a $B_0$-field, with field strengths from 0.2 tesla to 7 tesla and more, such that the nuclear spins thereof are orientated along the main magnetic field. Radio frequency excitation pulses (RF pulses) are irradiated into the examination object to trigger nuclear spin resonances that can be measured as signals, the nuclear spin resonances triggered are measured as what is known as k-space data and MR images are reconstructed on the basis thereof or spectroscopic data is acquired. For spatial encoding of the measured data, rapidly switched magnetic gradient fields, known as gradients for short, are superimposed on the main magnetic field. A schedule used that describes a chronological sequence of RF pulses and of gradients to be applied is described as a pulse sequence (schedule) or is also known for short as a sequence. The measured data is digitalized and stored as complex numerical values in a k-space matrix. From the k-space matrix that is filled with values, an associated MR image can be reconstructed, by means of a multi-dimensional Fourier transform, for example.

The method probably most widely used to generate echo signals after excitation of the nuclear spins is what is known as the spin echo method. In the simplest scenario, this involves the transverse magnetization being "flipped" so to speak by irradiating at least one RF refocusing pulse after irradiation of the RF excitation pulse, as a result of which the de-phased magnetization is rephased again and therefore, after a time TE known as the echo time, what is known as a spin echo SE is generated after the RF excitation pulse.

The excitation and measurement of the echo signals generated are repeated after a repetition time TR (for example, by applying various gradients for spatial encoding) until the desired number of echo signals have been measured and stored in the k-space in order to be able to map the examination object.

Among SE sequences, it is the TSE-sequences (TSE="Turbo Spin Echo") in particular, which are also known by the names FSE- ("Fast Spin Echo") or RARE ("Rapid Acquisition with Refocused Echoes"), that are widespread in clinical applications. The advantage of TSE sequences compared with a "simple" SE sequence is that after an RF excitation pulse, a plurality of refocusing pulses are applied, and that, as a result thereof, a plurality of spin echo signals SE are also generated after an excitation. As a result, the data acquisition is accelerated since fewer repetitions of the sequence with a different spatial encoding are required for all the desired data to be measured. Compared with conventional SE methods, the measurement time for the entire k-space is therefore reduced in TSE sequences according to the number of echo signals that are refocused and acquired after excitation, a phenomenon known as the "turbo factor".

The desire for faster and faster MR acquisitions in the clinical environment is currently leading to a renaissance in methods in which a plurality of images are acquired simultaneously. In general, these methods can be characterized by the fact that, at least for part of the measurement, transverse magnetization of at least two slices at the same time is used simultaneously for the imaging process ("multi-slice imaging", "slice-multiplexing"). In contrast with this method, in established "multi-slice imaging" the signal from at least two slices is acquired alternately, that is, completely independent of one another with a corresponding longer measurement time.

Known methods used for this are, for example, what is known as Hadamard encoding, methods with simultaneous echo-refocusing, methods with broadband data acquisition or even methods that use parallel imaging in the slice direction. The latter methods also include for example, the CAIPIRINHA technique, as described by Breuer et al. in "Controlled Aliasing in Parallel Imaging Results in Higher Acceleration (CAIPIRINHA) for Multi-Slice Imaging", Magnetic Resonance in Medicine 53, 2005, pp. 684-691, and the blipped CAIPIRINHA technique, as described by Setsompop et al. in "Blipped-Controlled Aliasing in Parallel Imaging for Simultaneous Multislice Echo Planar Imaging With Reduced g-Factor Penalty", Magnetic Resonance in Medicine 67, 2012, pp. 1210-1224.

Such slice multiplexing methods use what is known as a multiband RF pulse in order to excite two or more slices at the same time or to otherwise manipulate them, for example, to refocus or saturate them. Here such a multiband RF pulse is for example, a multiplex of individual RF pulses, which would be used for manipulating the individual slices that are to be manipulated at the same time. In order to be able to separate the resulting signals originating from the various slices, a different phase is imprinted in each case on the individual RF pulses, for example, prior to multiplexing, for example, by adding a linear phase increase, by means of which the slices are shifted with respect to one another in the local space. By multiplexing, one obtains, for example, a baseband-modulated multiband RF pulse from an addition of the pulse shapes of the individual RF pulses.

As described in the aforementioned article by Setsompop et al. for example, g-factor disadvantages can be reduced by imposing shifts between the slices, using gradient blips for instance, or by the phases of the individual RF pulses being modulated accordingly. As was likewise mentioned in the cited article by Setsompop et al. but also already described in the cited article by Breuer et al., the signals from the slices excited at the same time or otherwise manipulated can be combined initially as signals from only one slice in order to then be separated in the post-processing by means of a parallel reconstruction method, for example, a (slice) GRAPPA method (GRAPPA="Generalized Autocalibrating Partial Parallel Acquisition") or a different parallel imaging method (PPA), such as, for example, a SENSE method (SENSE=Sensitivity encoding").

For such a separation of slices involving collapsed acquisition, individually acquired reference data is typically used for each of the slices, said data having been measured, for example, in a pre-scan.

If a slice multiplexing method with the aforementioned gradient blips, and a TSE sequence for example, is used, in acquisitions without any suppression of spin signals from at least one type of tissue, for example in non-fat-saturated acquisitions, ghosting artifacts can be observed in the resulting images.

SUMMARY

An object underlying the disclosure is to reduce artifacts in slice multiplexing methods, in particular without fat saturation.

The disclosure is based on the realization that ghost artifacts can result from a varying effect that the gradient blips used can have on spins in different types of tissue. Due to a difference in the resonance frequencies of spins present in different tissues, known as chemical shift, in water and fat tissue, for example, the spins in the different types of tissue are not excited in one and the same slice, but in slices that have been shifted in respect of one another other by a slice distance $\Delta z$. Hence, the gradient blips used in the slice direction also induce different phase shifts, also known as "FOV="field of view" shifts"), for spins bound in different types of tissue. Generally speaking, the gradient blips are selected such that they produce the desired phase shift for spins bound in water, as a result of which, however, they produce a different phase shift for spins that are bound in fat, for example. Yet, there is a further correlation of the phase shift for the spins in all types of tissue with the gradient moments of the gradient blips used.

Furthermore, other undesirable effects that interfere with the magnetization of the spins can influence a signal strength that is prevalent while the gradient blips are applied, in particular since gradient blips can be used with different gradient moments during acquisition. Such effects can comprise for example, eddy currents, (even slight) violations of the CPMG (Carr Purcell Meiboom Gill) condition, or different signal strengths of the FID (free induction decay) signals, which for example, the gradient blips can continue to cause due to different signal-crushing effects.

Furthermore, ghost artifacts can be intensified by discrepancies first in the acquisition parameters used in the imaging and second in the acquisition of reference data for slice separation, such as, for example, slice profile, bandwidth of the RF pulses, flip angle, or relaxation times.

The object is achieved by reconstructing single-slice image data sets from k-space measured data sets that have been acquired simultaneously from at least two slices from an examination object as described herein with respect to various aspects and claims.

A method according to the disclosure for reconstructing single-slice image data sets from k-space measured data sets that have been acquired simultaneously from at least two slices from an examination object comprises the steps:

a) Loading a k-space measured data set (MD), which comprises measured data that has been acquired simultaneously for at least two slices from an examination object along set k-space trajectories, b) Reconstructing each respective reference slice image data set for each of the at least two slices from the k-space measured data set, c) Determining a test region for the reference slice image data sets, in which no artifacts are expected, d) Determining reference values for each of the at least two slices by analyzing the test region in the respective reference slice image data sets, e) Modifying at least one of the parameters that characterize the set k-space trajectory, f) Reconstructing in each case one test slice image data set for each of the at least two slices from the k-space measured data set using the modified parameters, g) Determining test reference values that correspond with the reference values for each of the at least two slices by analyzing the test region in the respective test slice image data sets, h) Repeating steps e) to g) with a modification that differs from the modifications already tested until an abort criterion is fulfilled, i) Comparing the reference values and the test reference values in accordance with a quality criterion, j) Storing the parameters ($P_i$) associated with the best of the reference values (R1 . . . Rn) and the test reference values ($R1_i^* \ldots Rn_i^*$) according to the comparison.

Slice image data sets of the individual slices in which artifacts are reduced compared with the reference slice image data sets can now be reconstructed from the k-space measured data set, using the stored parameters.

The method allows a retrospective reduction of artifacts, in particular of slice cross-talk artifacts, and hence an improvement in image quality in image data sets of individual slices acquired using a slice multiplexing technique, without a measurement time required for the acquisition of the measured data having to be extended.

A magnetic resonance installation according to the disclosure comprises a magnet unit, a gradient unit, a radio frequency unit and a control apparatus with a parameter modification unit, which apparatus is embodied to carry out a method according to the disclosure.

A computer program according to the disclosure implements a method according to the disclosure on a control apparatus when it is executed on the control apparatus.

The computer program can also be provided here in the form of a computer program product, which can be loaded directly into a memory of a control apparatus, with program coding means to carry out a method according to the disclosure when the computer program product is executed in the computing unit of the computing system.

An electronically readable data carrier according to the disclosure comprises electronically readable control information stored thereon, which information comprises at least one computer program according to the disclosure and is embodied such that, when the data carrier is used in a control apparatus of a magnetic resonance installation, the control information carries out a method according to the disclosure.

The advantages and explanations set out with reference to the method also apply by analogy to the magnetic resonance installation, the computer program product and the electronically readable data carrier.

BRIEF DESCRIPTION OF THE DRAWINGS

Further advantages and details of the present disclosure will emerge from the exemplary aspects that are described hereinafter and from the drawing. The examples set out do not represent any restriction of the disclosure. In the drawing.

DETAILED DESCRIPTION

Figure 1:
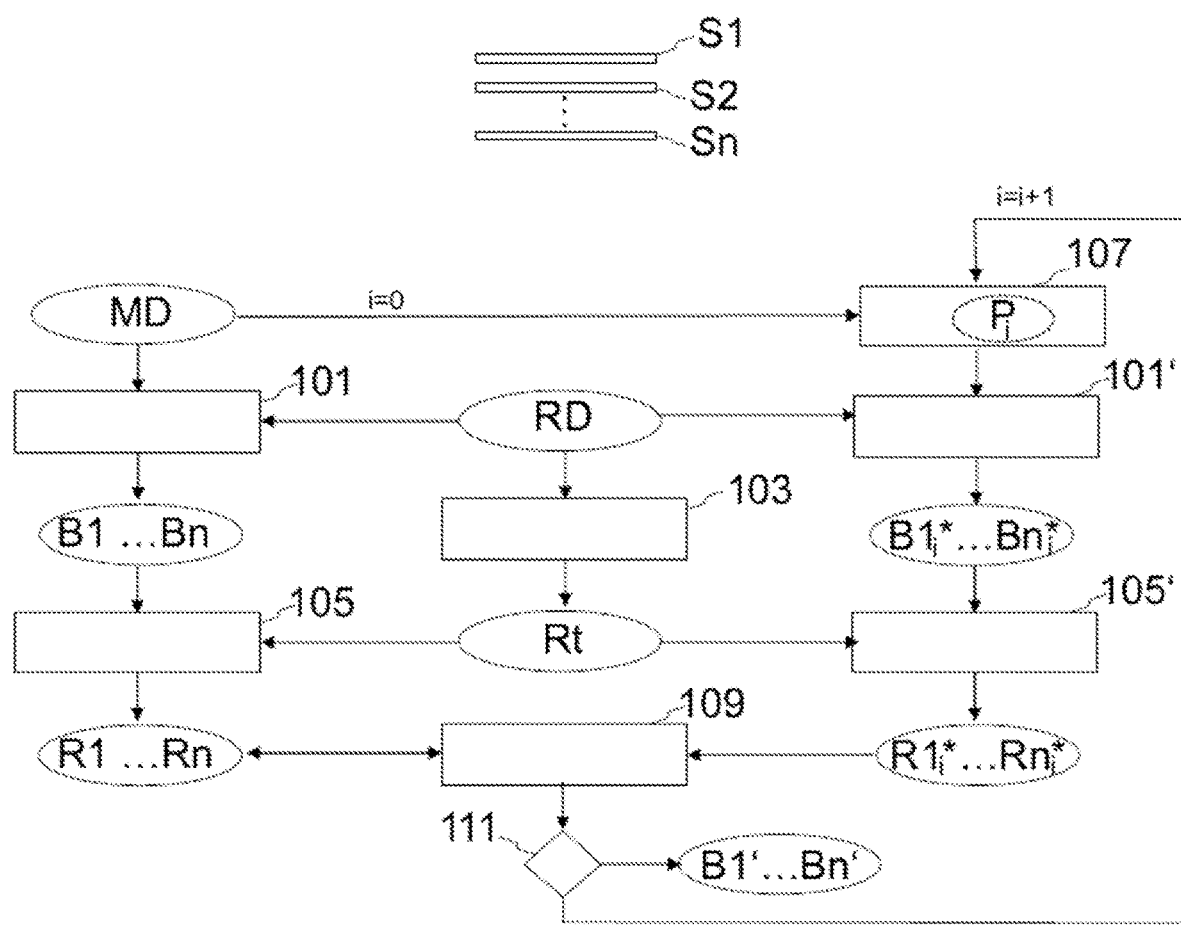
FIG. 1 shows an example schematic flow diagram of a method according to the disclosure.

FIG. 1 is an example schematic flow diagram of a method according to the disclosure for reconstructing single-slice image data sets from k-space measured data sets that have been acquired simultaneously from at least two slices from an examination object.

Here a k-space measured data set MD is loaded, which comprises measured data that has been acquired simultaneously for at least two slices S1, S2, ..., Sn from an examination object along set k-space trajectories, for example along k-space lines. The at least two slices S1, S2, ..., Sn can be n slices from a total of N (N≥n) slices from the examination object that are to be examined. The simultaneous acquisition of the measured data can be achieved using a slice multiplexing technique, in particular using gradient blips to imprint desired phase shifts.

From the k-space measured data set MD, a reference slice image data set B1 ... Bn that comprises image data for the respective slice (block 101) is reconstructed for each of the at least two slices S1, S2, ..., Sn. The collapsed measured data acquired for the at least two slices S1, S2, ..., Sn along the k-space trajectories has been separated for this purpose into data for the individual slices, by means of a slice GRAPPA method, for example, or where necessary, by means of a Fourier transform. In general, the reconstruction can proceed according to the slice multiplexing technique used in the acquisition of the measured data. The k-space trajectories used reflect a desired spatial encoding of the acquired measured data.

For the reference slice image data sets B1 ... Bn, a test region Rt in which no artifacts are expected (block 103) is determined.

Here, test regions Rt of various reference slice image data sets B1 ... Bn may vary. As a result thereof, an individually adjusted test region Rt can be selected for each reference slice image data set B1 ... Bn. Alternatively, it is also possible to search for a test region Rt, for which no artifacts are expected in all the reference slice image data sets B1 ... Bn. It is conceivable that neural networks that have been trained accordingly and have already been used where necessary for quality assurance will determine test regions by, for example, evaluating anatomical regions with regard to the incidence of artifacts.

A test region Rt can be selected here as a region in the respective reference slice image data set B1 ... Bn, in which region the examination object is not supposed to be mapped. In this way, test regions Rt can easily be determined by means of a segmentation method that segments the examination object, for example.

If alongside the k-space measured data MD, for example, reference data RD has also been acquired for each of the at least two slices S1, S2, ..., Sn for a calibration or for the determination of coil sensitivities for a reconstruction of image data sets, the determination of the test region Rt in image data for the slices S1, S2, ..., Sn that has been reconstructed from the reference data RD can ensue. In particular, if the reference data RD has been acquired with a lower resolution, a determination of test regions can be accelerated due to the lower volume of data. Furthermore, the reference data RD can also be obtained from a subset of measured data MD acquired for imaging. For example, the central k-space lines can be used to obtain a low-resolution data set.

Here the determination of the test region Rt can take into account the FOV-shifts used to acquire the k-space measured data set MD. In particular, the assigning of a test region to one of the individual slices can be adjusted according to the FOV-shift. This can be advantageous in particular if FOV-shifts>1 are used, and test regions have been determined in image data reconstructed from reference data. If the collapsed measured data acquired along the k-space trajectories for the at least two slices S1, S2, ..., Sn has been separated into data for the individual slices by means of a Fourier transform, in each case the test region should be a non-overlapping region of the at least two simultaneously acquired slices S1, S2, ... Sn.

A test region Rt can be stored for example, in the form of a mask which, when applied to image data sets, still allows only one observation of the test region in the image data set.

For each of the at least two slices S1, S2, ..., Sn, a reference value R1 ... Rn is determined in each case by analyzing the test region Rt, in particular by analyzing the signal strengths prevalent in the test region Rt, in the respective reference slice image data sets B1 ... Bn (block 105). Here the reference values are selected in particular such that they correlate with interference in the image, for example, with the appearance of artifacts.

For example, a reference value R1 ... Rn for a test region Rt can reflect a signal strength prevalent in the test region, in particular a mean signal strength in the test region Rt. This can also be determined easily, even via applications using neural networks that have been trained accordingly, for example, and compared with an expected value. In particular, if the test region Rt has been selected such that it was not intended for the examination object to be mapped in said region, and therefore no signal strength is expected, a signal strength that is prevalent in a test region despite this indicates the presence of interference.

In a further step, at least one of the parameters $P_i$ that characterize the k-space trajectory used is modified (block 107). As a result thereof, a spatial encoding of the acquired measured data assumed for the acquired measured data is adjusted.

A parameter $P_i$ that characterizes a set k-space trajectory can be, for example, an amplitude of a gradient that is applied during the acquisition of the measured data for the k-space measured data set MD, in particular of a readout gradient, and/or can be a phase applied during the acquisition of the measured data in the k-space measured data set MD.

A modification of a parameter $P_i$ can be an adjustment by a constant value and/or an adjustment according to a desired function, for example, according to a linear increase.

Here it is conceivable that different parameters $P_i$ can be adjusted differently in the modification of the parameters for a k-space trajectory that is used. For example, in a modification of a k-space line used as a k-space trajectory, an amplitude of a readout gradient can be adjusted by a constant value, and a phase imprinted during acquisition by adding a linear increase.

When using the modified parameters $P_i$, a test slice image data set $B1_i^*$ ... $Bn_i^*$ is reconstructed from the k-space measured data set MD (block 101') for each of the at least two slices S1, S2, ..., Sn. Here, apart from using the modified parameters $P_i$, and hence assuming an adjusted spatial encoding, the method proceeds in a similar manner to block 101.

Test reference values $R1_i^*$ ... $Rn_i^*$ corresponding with the reference values R1 ... Rn are determined for each of the at least two slices S1, S2, ..., Sn by analyzing the test region in the respective test slice image data sets $B1_i^*$ ... $Bn_i^*$ (block 105'). Test reference values $R1_i^*$ ... $Rn_i^*$ corresponding with the reference values R1 ... Rn can easily be obtained by analyzing the test slice image data sets $B1_i^*$ ... $Bn_i^*$ in block 105' in a similar manner to that used with reference image data sets B1 ... B2 in block 105.

Reference values R1 . . . Rn are compared with test reference values $R1_i^*$ . . . $Rn_i^*$ in accordance with a quality criterion (block 109). In particular, the associated reference value for at least one of the at least two slices S1, S2, . . . , Sn can be compared with the at least one test reference value that corresponds with the same slice. Advantageously, the comparison is for all of the at least two slices S1, S2, . . . , Sn. It is conceivable here for a better value (R1 . . . Rn or $R1i^*$ . . . $Rni^*$) according to the comparison to be retained as a new current reference value R1 . . . Rn in order to compare the next test reference value with the new current reference value. At least the parameters $P_i$ associated with the best reference values (R1 . . . Rn) and test reference values ($R1_i^*$ . . . $Rn_i^*$) according to the comparison are stored.

The quality criterion describes a degree of freedom from artifacts and allows an evaluation of the reference values R1 . . . Rn and test reference values $R1_i^*$ . . . $Rn_i^*$. If the reference values correlate with interference in the image, the quality criterion can be selected such that it allows an evaluation of whether the reference value or the test reference value compared therewith correlates with greater interference and can feed back as a better value the one that correlates with less interference.

If a reference value R1 . . . Rn for a test region Rt reflects a signal strength for example, the quality criterion can require a low as possible signal strength in a test region. Here a comparison of reference value and associated test reference value can identify the one that has a lower signal strength as being the better value.

Blocks 107, 101' and 105' are repeated with a modification that differs in each case from modifications of the at least one parameter $P_i$ that have already been tested until an abort criterion (query 111) is fulfilled. Here, the comparison (block 109) can also be repeated in each case for the current reference values and test reference values. In a simple exemplary aspect it is also conceivable, however, for the comparison to be carried out only after all the desired modifications between the available reference data and the test reference data have been carried out.

Modifications made in various passes of block 107 can, for example, adjust at least one parameter $P_i$, gradually in predetermined values in ascending or descending order, or according to an optimization algorithm, for example, a greedy algorithm, in particular a golden section search, or a binary search algorithm. A run-through of predetermined values can already achieve good results and establishes the time and computing outlay required for the iterations. A use of optimization algorithms can lead to better results but can also increase the time and computing outlay or at least make it more unpredictable.

The abort criterion can take into account a predetermined number of passes (counter i) in block 107 and/or a minimum threshold value for a result of a comparison of reference values R1 . . . Rn with test reference values $R1i^*$ . . . $Rni^*$. For example, the abort criterion can be fulfilled after a desired number Z of different modifications that have been carried out. Additionally or alternatively, the abort criterion can be fulfilled if the result of the comparison is that all the test reference values show at best a negligible improvement compared with the current reference values. What is defined as negligible can be defined according to each application. The higher the values that are considered to be negligible, the faster the abort criterion is fulfilled, and the lower a value has to be for it to be defined as negligible, the greater is the improvement in quality that is achievable with the method.

If the abort criterion is fulfilled (query 111, arrow pointing to the right), slice image data sets B1' . . . Bn' can be reconstructed from the k-space measured data set MD using the parameters $P_i$, in which interference such as ghost artifacts is reduced, and which associated with the best of the reference values R1 . . . Rn and test reference values $R1_i^*$ . . . $Rn_i^*$ according to the comparison.

By means of iterative modification, the method described here allows the optimization of the underlying k-space trajectories in the reconstruction of individual image data sets and hence a retrospective reduction of interference in the individual image data sets.

If the method has been carried out for a tuple of at least two slices S1, S2, . . . , Sn that are to be recorded simultaneously from a total of N (N>n) slices that are to be recorded simultaneously, the parameters $P_i$ obtained when carrying out a single pass can also be used when carrying out further tuples to achieve a reduction in interference. This therefore saves computing outlay and computing time. If, for example, two slices are acquired simultaneously per tuple, and if a total of eight slices are to be measured, the parameters determined according to the disclosure for one of the two-part tuples can also be used for the three further two-part tuples. Alternatively, separate parameters $P_i$ can also be determined for each tuple, as a result of which the reduction in the artifacts can be increased.

Figure 2:
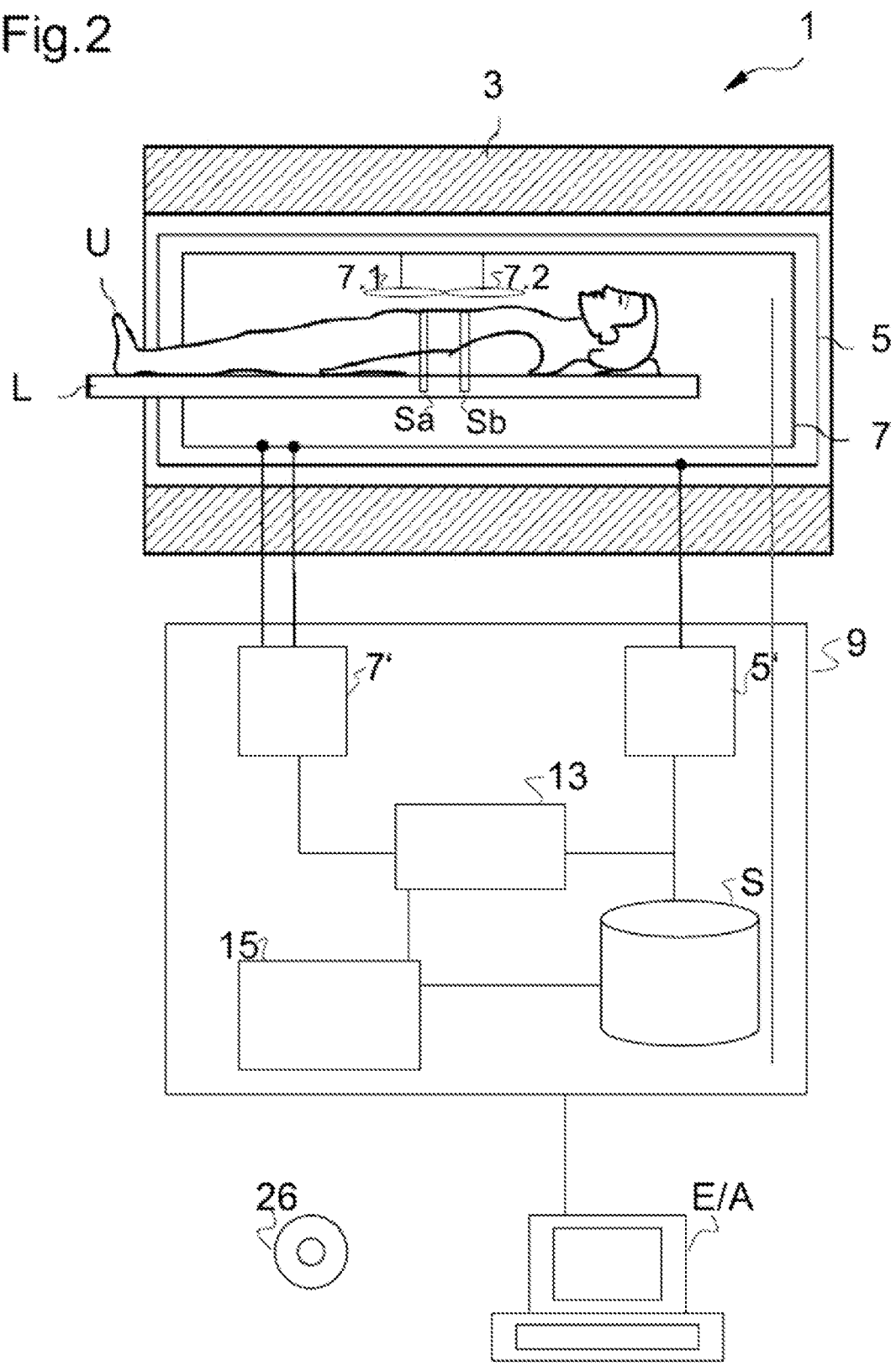
FIG. 2 shows an example schematic representation of the magnetic resonance installation according to the disclosure.

FIG. 2 shows in schematic form an example of a magnetic resonance installation 1 according to the disclosure. This comprises a magnet unit 3 for generating the main magnetic field, a gradient unit 5 for generating the gradient field, a radio frequency unit 7 for irradiation and for receiving radio frequency signals and a control apparatus 9 embodied for carrying out a method according to the disclosure.

FIG. 2 shows these sub-units of the magnetic resonance installation 1 in only a roughly schematic form. In particular, the radio frequency unit 7 can consist of a plurality of sub-units, for example, of a plurality of coils such as the coils 7.1 and 7.2, shown in schematic form, or more coils, which can either be embodied only to transmit radio frequency signals or only to receive the radio frequency signals that have been triggered or be embodied to do both.

For examining an examination object U, a patient or also a phantom, for example, this object can be inserted on a couch L into the magnetic resonance installation 1 into the measuring compartment thereof. The slices Sa and Sb exemplarily represent slices of the examination object that are to be acquired simultaneously, from which echo signals are to be acquired and recorded as measured data.

The control apparatus 9 is used to control the magnetic resonance installation 1 and in particular can control the gradient unit 5 by means of a gradient control 5' and the radio frequency unit 7 by means of a radio frequency unit 7'. Here the radio frequency unit 7 can comprise a plurality of channels on which signals can be transmitted or received.

The radio frequency unit 7 is responsible, together with its radio frequency transmit/receive control 7', for generating and irradiating (transmitting) a radio frequency alternating field to manipulate the spins in a region to be manipulated (for example, in slices S to be measured) in the examination object U. The center frequency of the radio frequency alternating field, also known as the B1 field, is generally set where possible such that it is close to the resonance frequency of the spins that are to be manipulated. Deviations of the center frequency from the resonance frequency are known as off-resonance. To generate the B1 field, controlled currents are applied to the RF coils in the radio frequency unit 7 by means of the radio frequency transmit/receive control 7'.

Furthermore, the control apparatus 9 comprises a parameter modification unit 15, with which modifications of parameters carried out according to the disclosure can be used. As a whole, the control apparatus 9 is embodied to carry out a method according to the disclosure.

A computing unit 13 comprised by the control apparatus 9 is embodied to carry out all the necessary computing operations for the necessary measurements and determinations, also in particular for comparisons and determinations according to the disclosure of reference values that are to be retained and associated parameters. Interim results and results required for this purpose can be stored in a memory unit S of the control apparatus 9. The units shown are not necessarily to be understood as physically separate units, but merely represent a sub-division into units of meaning, which can also, however, be implemented for example, in fewer or even in only one single physical unit.

Via an input/output apparatus E/A of the magnetic resonance installation 1, control commands can be directed to the magnetic resonance installation by a user, for example, and/or results can be displayed to the control apparatus 9 as image data, for example.

A method described here can also be provided in the form of a computer program product, which comprises a program and implements the described method on a control apparatus 9 when it is executed on the control apparatus 9. Likewise an electronically readable data carrier 26 with electronically readable control information stored thereon, which is embodied to comprise at least one such computer program product that has just been described and is embodied such that it carries out the method described when the data carrier 26 is used in a control apparatus 9 of a magnetic resonance installation 1.

The invention claimed is:

1. A method using a magnetic resonance apparatus for reconstructing single-slice image data sets from k-space measured data sets which have been acquired simultaneously from at least two slices identified with an examination object, comprising:
    a) loading a k-space measured data set, which comprises measured data that has been acquired simultaneously for at least two slices from an examination object along set k-space trajectories;
    b) reconstructing one reference slice image data set in each case for each of the at least two slices from the k-space measured data set;
    c) determining a test region for the reference slice image data sets in which no artifacts are expected;
    d) determining reference values for each of the at least two slices by analyzing the test region in the respective reference slice image data sets;
    e) modifying at least one of parameters that characterize a set k-space trajectory;
    f) reconstructing one test slice image data set in each case for each of the at least two slices from the k-space measured data set using the modified parameters;
    g) determining test reference values that correspond with the reference values for each of the at least two slices by analyzing the test region in the respective test slice image data sets;
    h) repeating steps e) to g) with a modification that differs from the modifications already tested until an abort criterion is fulfilled;
    i) comparing the reference values and the test reference values in accordance with a quality criterion; and
    j) storing the parameters associated with a best among the reference values and the test reference values according to the comparison,
    wherein the steps a) to j) are performed by control circuitry of the magnetic resonance apparatus, and a result of the steps a) to j) are stored in a memory or displayed on an output apparatus as image data.

2. A magnetic resonance apparatus for reconstructing single-slice image data sets from k-space measured data sets which have been acquired simultaneously from at least two slices identified with an examination object, comprising:
    a magnet unit;
    a gradient unit;
    a radio frequency transmit/receive controller;
    a parameter modification unit; and
    control circuitry configured to cause the magnetic resonance apparatus to:
        a) load a k-space measured data set, which comprises measured data that has been acquired simultaneously for at least two slices from an examination object along set k-space trajectories;
        b) reconstruct one reference slice image data set in each case for each of the at least two slices from the k-space measured data set;
        c) determine a test region for the reference slice image data sets in which no artifacts are expected;
        d) determine reference values for each of the at least two slices by analyzing the test region in the respective reference slice image data sets;
        e) modify at least one of parameters that characterize a set k-space trajectory;
        f) reconstruct one test slice image data set in each case for each of the at least two slices from the k-space measured data set using the modified parameters;
        g) determine test reference values that correspond with the reference values for each of the at least two slices by analyzing the test region in the respective test slice image data sets;
        h) repeat steps e) to g) with a modification that differs from the modifications already tested until an abort criterion is fulfilled;
        i) compare the reference values and the test reference values in accordance with a quality criterion; and
        j) store the parameters associated with a best among the reference values and the test reference values according to the comparison,
    wherein a result of the steps a) to j) are stored in a memory or displayed on an output apparatus as image data.

3. A non-transitory computer-readable medium having instructions stored thereon that, when executed by one or more processors associated with a magnetic resonance apparatus, cause the magnetic resonance apparatus to acquire measured data that has been recorded simultaneously from at least two slices identified with an examination object by:
    a) loading a k-space measured data set, which comprises measured data that has been acquired simultaneously for at least two slices from an examination object along set k-space trajectories;
    b) reconstructing one reference slice image data set in each case for each of the at least two slices from the k-space measured data set;
    c) determining a test region for the reference slice image data sets in which no artifacts are expected;

d) determining reference values for each of the at least two slices by analyzing the test region in the respective reference slice image data sets;

e) modifying at least one of parameters that characterize a set k-space trajectory;

f) reconstructing one test slice image data set in each case for each of the at least two slices from the k-space measured data set using the modified parameters;

g) determining test reference values that correspond with the reference values for each of the at least two slices by analyzing the test region in the respective test slice image data sets;

h) repeating steps e) to g) with a modification that differs from the modifications already tested until an abort criterion is fulfilled;

i) comparing the reference values and the test reference values in accordance with a quality criterion; and j) storing the parameters associated with a best among the reference values and the test reference values according to the comparison, wherein a result of the steps a) to j) are stored in a memory or displayed on an output apparatus as image data.

4. The method as claimed in claim 1, wherein test regions of different reference slice image data sets can differ.

5. The method as claimed in claim 1, wherein a test region is a region in the reference slice image data sets in which the examination object is not intended to be mapped.

6. The method as claimed in claim 1, wherein alongside the k-space measured data, reference data has also been acquired for each of the at least two slices, and the determination of the test region ensues in image data reconstructed from the reference data.

7. The method as claimed in claim 1, wherein the determination of the test region takes into account field of view (FOV)-shifts used in the acquisition of the k-space measured data set.

8. The method as claimed in claim 1, wherein a parameter that characterizes a set k-space line is an amplitude of a gradient applied during the acquisition of the measured data in the k-space measured data set, a readout gradient, or is a phase applied during the acquisition.

9. The method as claimed in claim 1, wherein a modification of a parameter is an adjustment by a constant value or an adjustment in accordance with a linear increase.

10. The method as claimed in claim 1, wherein modifications made in various passes of step e) adjust at least one parameter gradually or according to an optimization algorithm, and wherein the optimization algorithm is a greedy algorithm, a golden-section search, or a binary search algorithm.

11. The method as claimed in claim 1, wherein the quality criterion describes a degree of freedom from artifacts.

12. The method as claimed in claim 1, wherein a reference value for a test region reflects a mean signal strength in the test region.

13. The method as claimed in claim 12, wherein the quality criterion requires a mean signal strength that is as low as possible in a test region.

14. The method as claimed in claim 1, wherein the abort criterion takes into account a predetermined maximum number of passes in step e) or a minimum threshold value for a result of a comparison that has been carried out of reference values with test reference values.

* * * * *